United States Patent
Gao

(10) Patent No.: US 11,856,729 B2
(45) Date of Patent: Dec. 26, 2023

(54) COMPATIBLE CO-DESIGN FOR SERVER AND RACK LIQUID INTERFACE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 386 days.

(21) Appl. No.: 17/207,082

(22) Filed: Mar. 19, 2021

(65) Prior Publication Data

US 2022/0304191 A1 Sep. 22, 2022

(51) Int. Cl.
*H05K 7/20* (2006.01)

(52) U.S. Cl.
CPC ..... *H05K 7/20272* (2013.01); *H05K 7/20772* (2013.01); *H05K 7/20781* (2013.01)

(58) Field of Classification Search
CPC ........... H05K 7/20272; H05K 7/20327; H05K 7/20772; H05K 7/20781
See application file for complete search history.

(56) References Cited

U.S. PATENT DOCUMENTS

| | | | |
|---|---|---|---|
| 10,405,458 B2 | 9/2019 | Fukunaga | |
| 11,553,627 B1 * | 1/2023 | Gregory | H05K 7/20781 |
| 2009/0161312 A1 * | 6/2009 | Spearing | H05K 7/20781 |
| | | | 361/679.53 |
| 2016/0066480 A1 * | 3/2016 | Eckberg | F16L 37/34 |
| | | | 361/679.53 |
| 2016/0270260 A1 | 9/2016 | Franz | |
| 2017/0127575 A1 * | 5/2017 | Lunsman | H05K 7/20263 |
| 2018/0242478 A1 * | 8/2018 | Cui | H01R 3/08 |
| 2018/0303007 A1 * | 10/2018 | Gao | H05K 7/20781 |

FOREIGN PATENT DOCUMENTS

CN 112020264 A 12/2020

* cited by examiner

*Primary Examiner* — Jacob R Crum
(74) *Attorney, Agent, or Firm* — WOMBLE BOND DICKINSON (US) LLP

(57) ABSTRACT

Disclosed are designs to facilitate blind-mating of fluid connectors on servers and on racks that house the servers. The design includes two plates. A first plate has a connector channel to guide the connectors of the server through the first plate and spring structures to apply a force to push the connectors of the server toward the center of the connector channel. A second plate has positioning holes around its perimeter for mounting the connectors of the server using the force of the spring structures. The first plate is rotatable around a rotation axis to align the connectors of the server with the connectors of the rack. The second plate may have an elastic layer that is compressed to change a width of the second plate by inserting the second plate to the rack to automatically align the connectors of the server and of the rack in the horizontal direction.

20 Claims, 15 Drawing Sheets

400

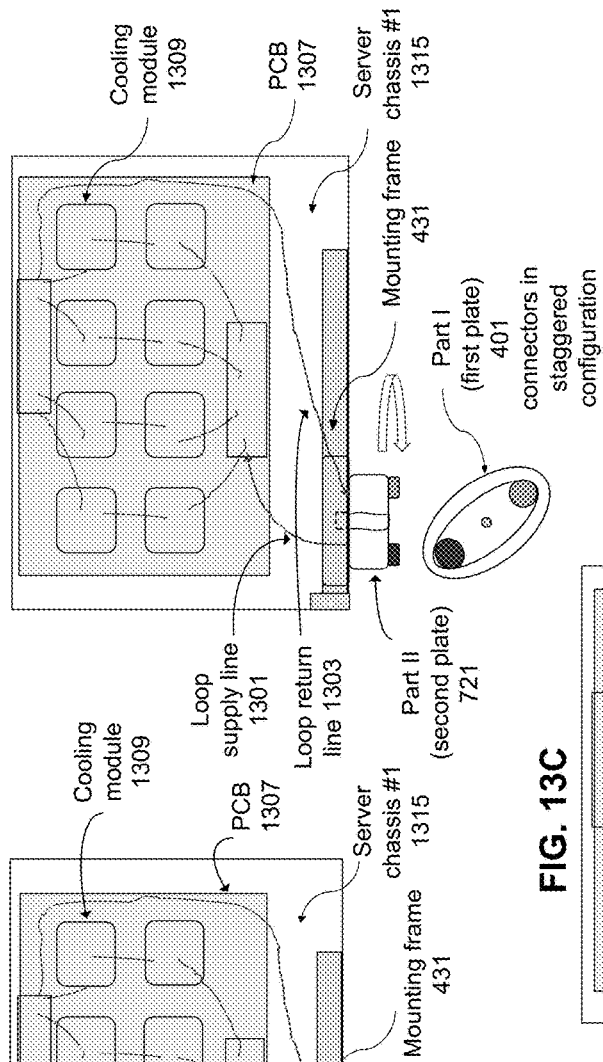
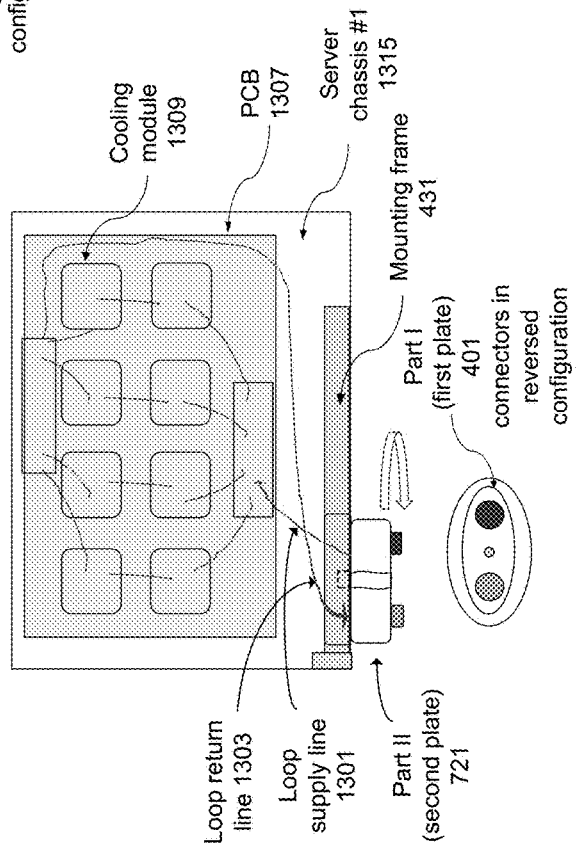
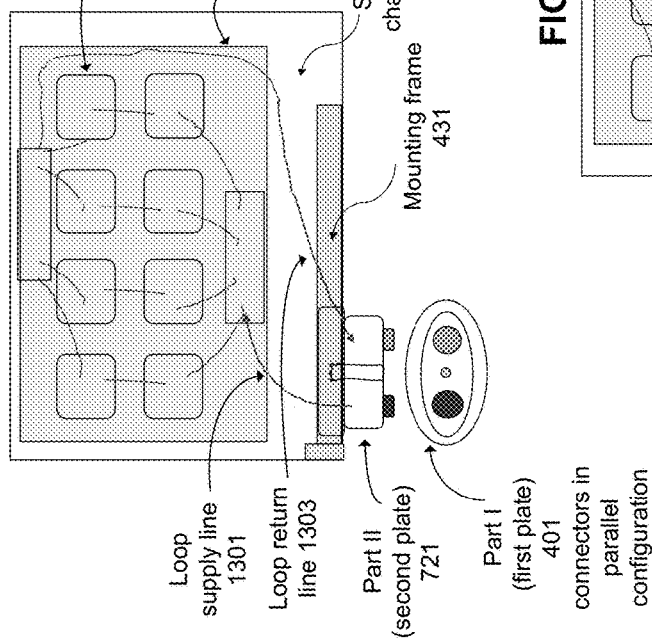
FIG. 13A
FIG. 13B
FIG. 13C

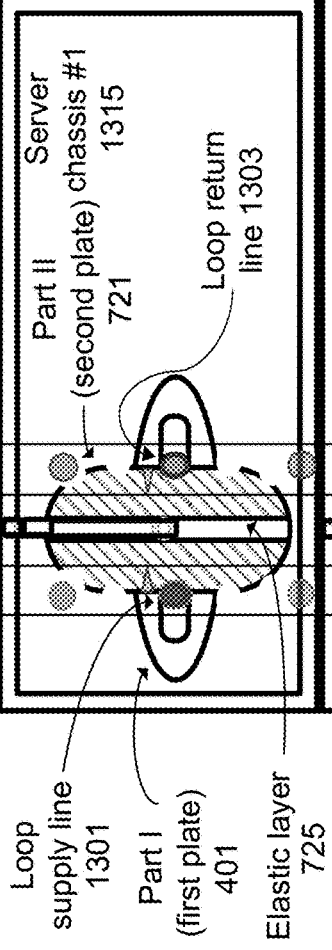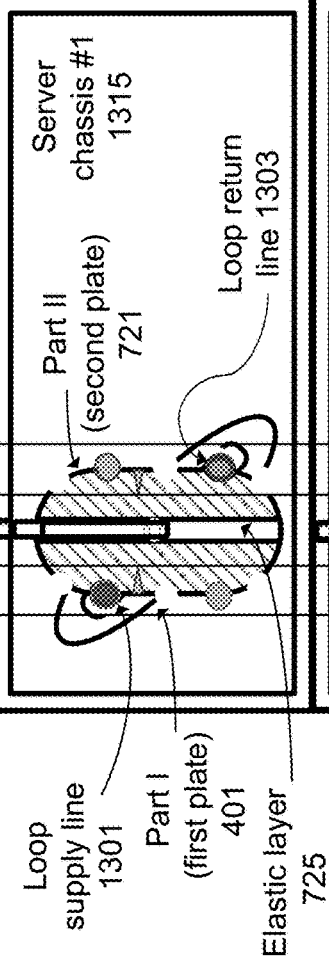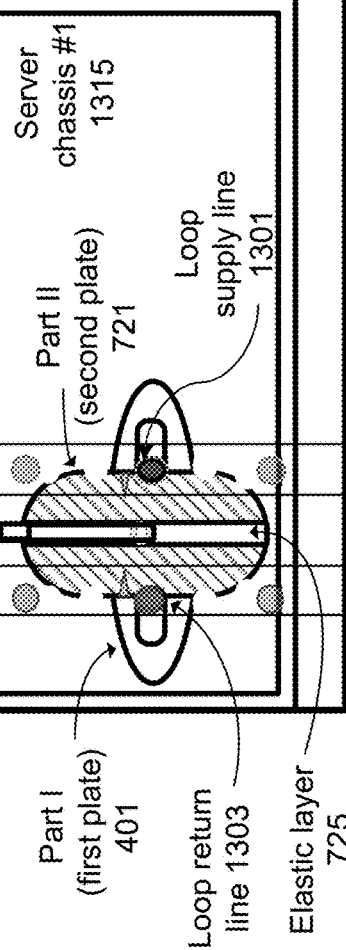
FIG. 14A   FIG. 14B   FIG. 14C

COMPATIBLE CO-DESIGN FOR SERVER AND RACK LIQUID INTERFACE

FIELD OF THE INVENTION

Embodiments of the present invention relate generally to server and data center cooling. More particularly, embodiments of the invention relate to blind-mating designs for connecting servers and racks to deliver and distribute fluid used in liquid cooling applications.

BACKGROUND

Cooling is a critical consideration in a computer system and data center design. The number of high performance electronics components such as high performance processors packaged inside servers has steadily increased, increasing the amount of heat generated and to be dissipated during the ordinary operations of the servers. The reliability of servers used within a data center decreases if the thermal environment in which they operate is permitted to increase in temperature over time. Maintaining a proper thermal environment is critical for normal operations of these servers in data centers, as well as for maximizing the server performance, reliability and lifetime. It requires more effective and efficient cooling solutions especially in the cases of cooling these high performance servers.

Servers and other high performance electronic components such as central processing units (CPU), graphical processing units (GPU), etc., are usually tightly packaged in clusters of highly integrated chips, boards, or assemblies that are housed in racks to yield very high heat densities. Liquid cooling applications that deliver and distribute fluids to carry away the heat generated by the servers may use blind-mating connectors to interconnect the fluid channels between the servers and racks. The fluid distribution channels on the racks, also referred to as rack side fluid manifold, may be built with connectors having various layouts such as locations, spacing for connecting to the connectors on the servers. The racks may also have various configurations or arrangements of inlet connectors that deliver cooling liquid to the servers and outlet connectors that receive warm liquid from the servers, such as in parallel or staggered configurations. Interoperability and reliability of the fluid connections between the racks and servers is critical for the proper fluid system integration and operation of the servers and data centers. Existing connection designs are often customized for a fixed type of servers, decreasing interoperability between servers and racks with different fluid manifold configurations, increasing cost and reducing the diversity of potential applications to the detriment suppliers of racks and servers, vendors, integrators, and end users. Reliability of the connections is critical since it is the juncture where leaks are mostly likely to occur due to the nature of blind mating fluid connection technology and a key to prevent malfunction or failures due to human operations or designs error.

In some use scenarios, it may be necessary to dynamically change the fluid connections between the racks and servers. Because the rack side fluid manifold is mostly a fixed design, design flexibility for guiding the server side connectors to properly mate with the rack side connectors is also an important consideration to ensure that the servers may populate all the racks to increase performance.

BRIEF DESCRIPTION OF THE DRAWINGS

Embodiments of the invention are illustrated by way of example and not limitation in the figures of the accompanying drawings in which like references indicate similar elements.

FIG. 13A illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a parallel configuration according to one embodiment.

FIG. 13B illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a staggered configuration according to one embodiment.

FIG. 13C illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a reversed configuration according to one embodiment.

FIG. 14A illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a parallel configuration corresponding to FIG. 13A according to one embodiment.

FIG. 14B illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a staggered configuration corresponding to FIG. 13B according to one embodiment.

FIG. 14C illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a reversed configuration corresponding to FIG. 13C according to one embodiment.

DETAILED DESCRIPTION

Figure 1:
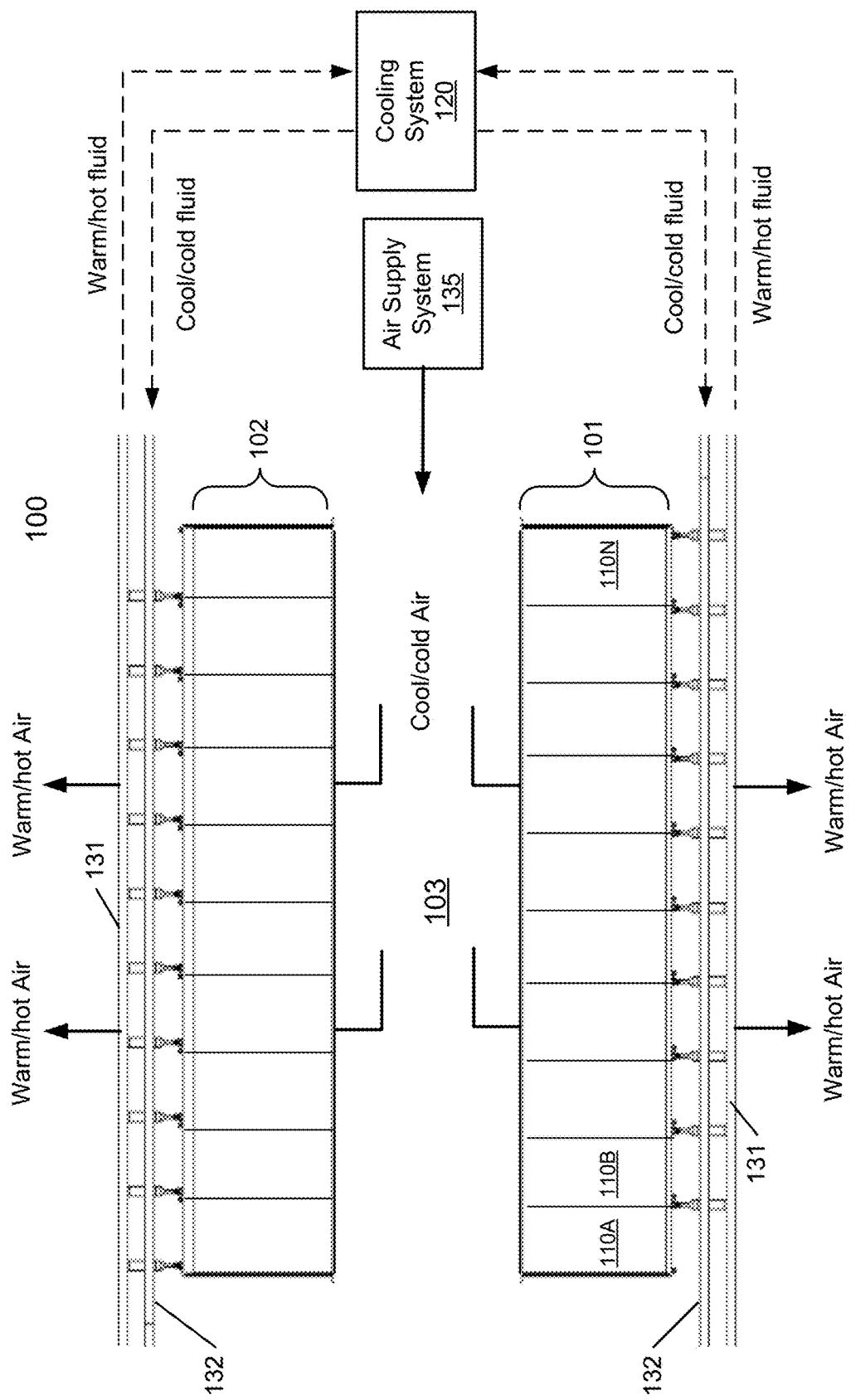
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed are designs to interconnect fluid connectors on servers and fluid connectors on racks that house the servers for the delivery and return of fluid used to cool the servers. The servers may have inlet connectors that receive cooling liquid from supply connectors on the racks to distribute the cooling liquid to the servers, and outlet connectors that emit heated liquid to return connectors on the racks to carry away the thermal energy from the servers. The disclosed designs provide the hardware to guide, adjust, and position the connectors of the servers to properly mate with the connectors of the racks to support interoperability of servers having different fluid distribution architectures and racks having different fluid manifold configurations. The designs may be used to provide a reliable and robust blind-mating fluid connections between the connectors, increasing flexibility, efficiency, and serviceability of the liquid cooling system and reducing cost to meet the demands of data centers with high heat densities.

In one aspect, a design includes two plates that may be jointly used to facilitate connecting the fluid connectors of a server and the fluid connectors of a rack in either a blind-mating manner or in a manual manner. A first plate has a connector channel to guide the connectors of the server through the first plate. The connector channel provides a range of possible positions for the connectors of the servers along one dimension and allows an adjustment of the horizontal distance between the connectors of the server to align with the horizontal distance between the connectors of the rack. The two ends of the connector channel each have a spring structure to apply a force to push the connectors of the server toward the center of the connector channel. A second plate has a number of positioning holes or positioning slots around its perimeter into which the connectors of the server may be mounted using the force exerted by the spring structure of the connector channel. The positioning holes allows an adjustment of the vertical distance between the connectors of the server in a number of possible values to align with the vertical distance between the connectors of the rack. The first plate may be attached to the second plate and rotated around a rotation axis to adjust jointly the horizontal and vertical distances between the connectors of the server to flexibly and securely align the positions of the connectors of the server and the connectors of the rack when mating the connectors. By using second plates with different dimensions and different locations of positioning holes, the connectors of the server may align with the connectors of the rack for different fluid manifold configurations. The force exerted by the spring structures from the opposite ends of the connector channel may be balanced to enable the assembly and secure mounting of two connectors of the server within the positioning holes of the joint assembly, ensuring a proper alignment between the connectors of the server and the connectors of the rack.

In one aspect, the second plate has an elastic layer and integrated guiding structures to extend the range of horizontal distance between the connectors of the server to align with the horizontal distance between the connectors of the rack. The elastic layer is expandable along its width along the horizontal direction to increase the width of the second plate. When the integrated guiding structures are not applied with an external force, the elastic layer is at its maximum width to cause the second plate to correspondingly have the maximum width. When the integrated guiding structures are applied with an external force to compress the elastic layer, the width of the second plate is correspondingly reduced. By varying the width of the elastic layer, the horizontal distance between the connectors of the server mounted into the positioning holes of the second plate may be adjusted. The compressed elastic layer applies an outward force to the second plate to counteract the inward force exerted by the spring structure of the connector channel of the first plate to securely hold the connectors of the server. The guiding structures of the elastic layer may be inserted or attached to the rack manifold to automatically adjust the relative distance between the connectors of the server in both the vertical and horizontal directions to align with the connectors of the server.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, an air supply system 135 and one or more optional cooling fans are associated with the server chassis to provide air cooling to the computing nodes contained therein. Note that the cooling system 120 may be coupled to multiple data center systems such as data center system 100. In one embodiment, a server liquid intake connector and a server liquid outlet connector of each server chassis may be connected to a rack liquid intake connector and a rack liquid outlet connector of the cooling liquid manifold, which is coupled to the liquid supply/return lines 132/131 of the data center.

Figure 2:
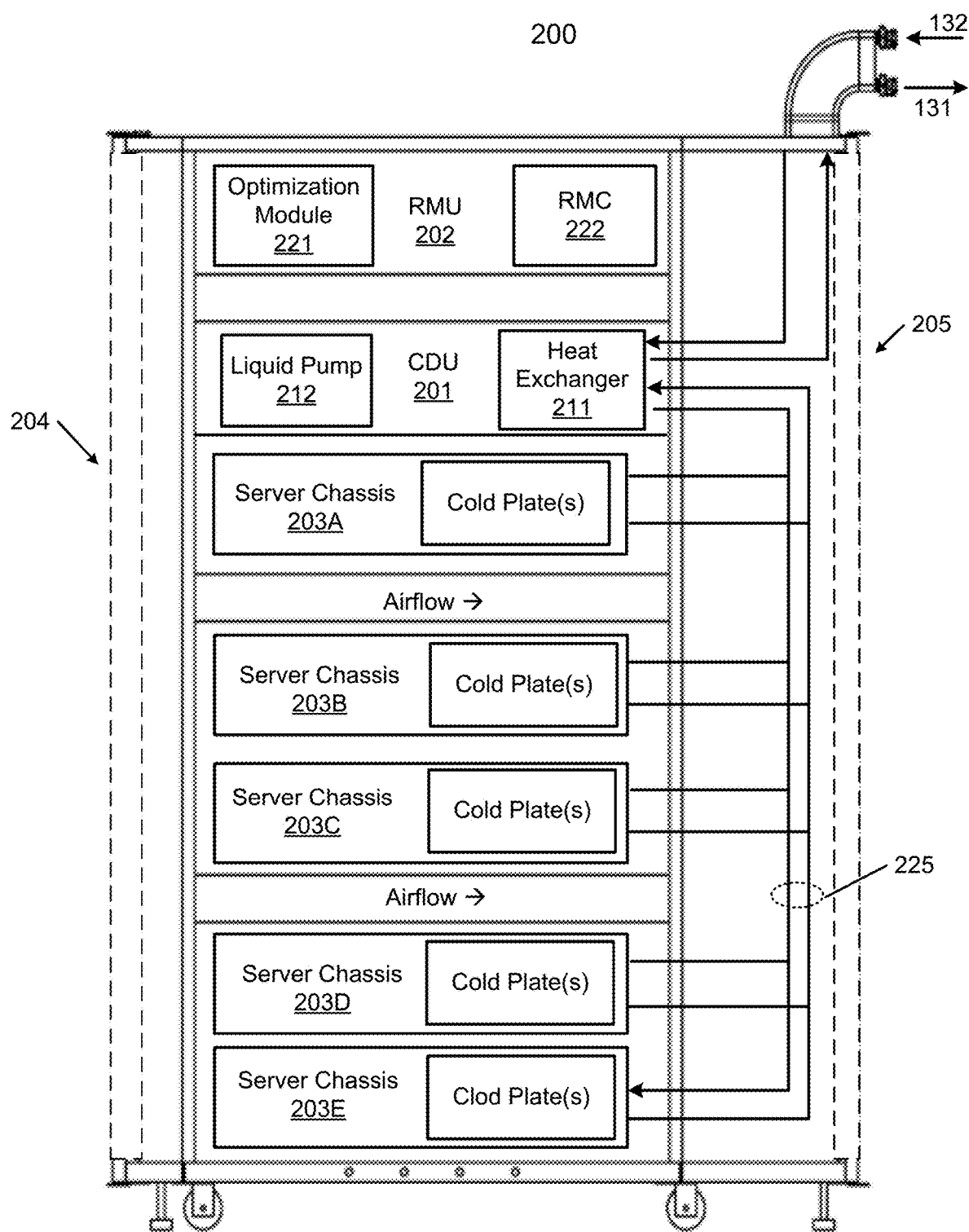
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
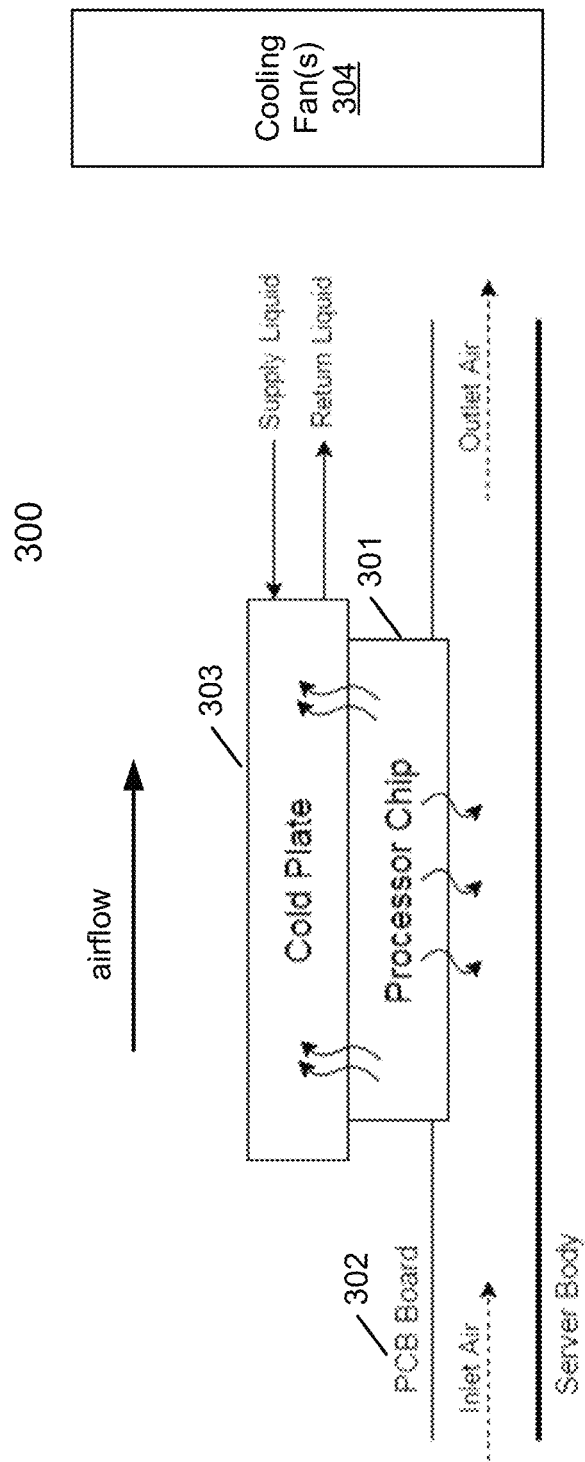
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131. A portion of the heat generated by processor 301 is removed by the cooling liquid via cold plate 303. The remaining portion of the heat enters into an air space underneath or above, which may be removed by an airflow generated by cooling fan 304. The supply liquid line 132 and return liquid line 131 maybe assembled with fluid connectors, which are the interface for connecting with the corresponding connectors on the rack. Design solutions of the current disclosure improves the reliability and robustness of this interface when integrating the cold plate assembly 300 or cooling modules to the rack and when connecting to the fluid recirculation system.

Figure 4:
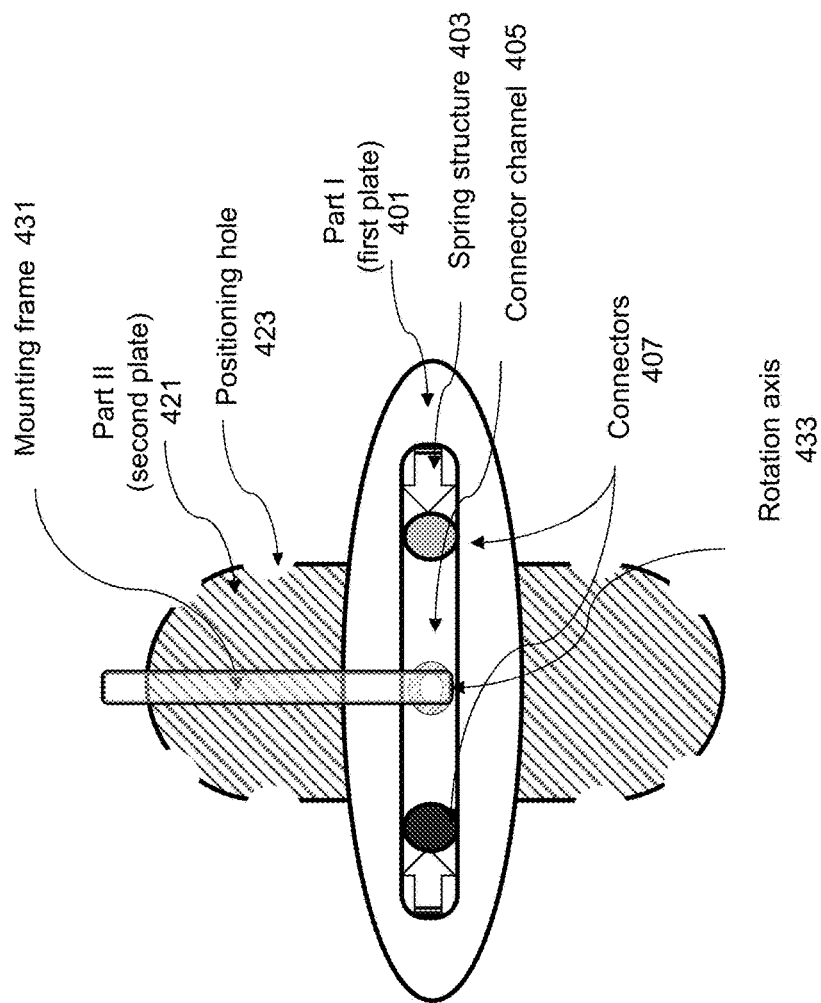
FIG. 4 illustrates an example of a first hardware design used for interconnecting between fluid connectors of a server and fluid connectors of a rack that allows an adjustment of the horizontal relative locations of the connectors of the server to match the connectors of the rack according to one embodiment.

FIG. 4 illustrates an example of a first hardware design 400 used for interconnecting between fluid connectors of a server and fluid connectors of a rack that allows an adjustment of the horizontal relative locations of the connectors of the server to match the connectors of the rack according to one embodiment. The design 400 includes two components, part I (401) and part II (421), also referred to as first plate 401 and second plate 421, respectively.

In one aspect, first plate 401 may have an oblong shape containing a connector channel 405 along the width or the longer dimension of first plate 401. A pair of connectors 407 of the server may be guided through connector channel 405 in a direction perpendicular to first plate 401. The pair of connectors 407 may include an inlet connector that receives cooling liquid from a supply connector of the rack to distribute the cooling liquid to the server and an outlet connector that emits heated liquid to a return connector of the rack to carry away the thermal energy generated by the server. The relative distance between the pair of connectors 407 may be adjusted along connector channel 405 to align with the relative distance between the corresponding connectors of the rack. Each end of connector channel 405 is designed with a spring structure 403 that applies a springing force to push connectors 407 toward each other. The springing force exerts a mounting pressure on connectors 407 to secure connectors 407 to second plate 421 when making connections to the connectors of the rack.

The second plate 421 has a number of positioning holes 423 situated around its perimeter into which connectors 407 may be mounted using the mounting pressure exerted by spring structure 403. First plate 401 and second plate 421 may be overlaid or stacked in an integrated assembly or in a detachable configuration. First plate 401 may rotate around a rotation axis 433 with respect to second plate 421 to allow connectors 407 to be mounted into different positioning holes 423 on second plate 421. Positioning holes 423 may correspond to possible positions of connectors of racks when hardware design 400 is attached to the rack using a mounting frame 431. In one aspect, the design of second plate 421 as well as the corresponding position holes 423 may be determined or highly correlated to the specification of the rack manifold. In one aspect, the connectors of rack may be the rack manifold 225 including the supply manifold and the return manifold of FIG. 2.

By rotating first plate 401 around rotation axis 433, connectors 407 of the server may be mounted into positioning holes 423 that align with the positions of the corresponding connectors of the rack. The combination of positioning holes 423 and connector channel 405 allows a range of selections to adjust the horizontal distance and vertical distances between connectors 407 of the server to flexibly match the fluid manifold configuration of the rack. FIG. 4 shows a scenario when the connectors of the rack are positioned along a horizontal plane in a parallel configuration. The first plate 401 is rotated to mount connectors 407 of the server into the pair of positioning holes 423 along the horizontal plane with zero relative vertical distance to align with the connectors of the rack. To further extend the range of adjustments of the horizontal and vertical distances of connectors 407 of the server to accommodate a diversity of rack manifolds, second plate 421 with different dimensions and different locations of positioning hole 423 may be attached to first plate 401.

Figure 5:
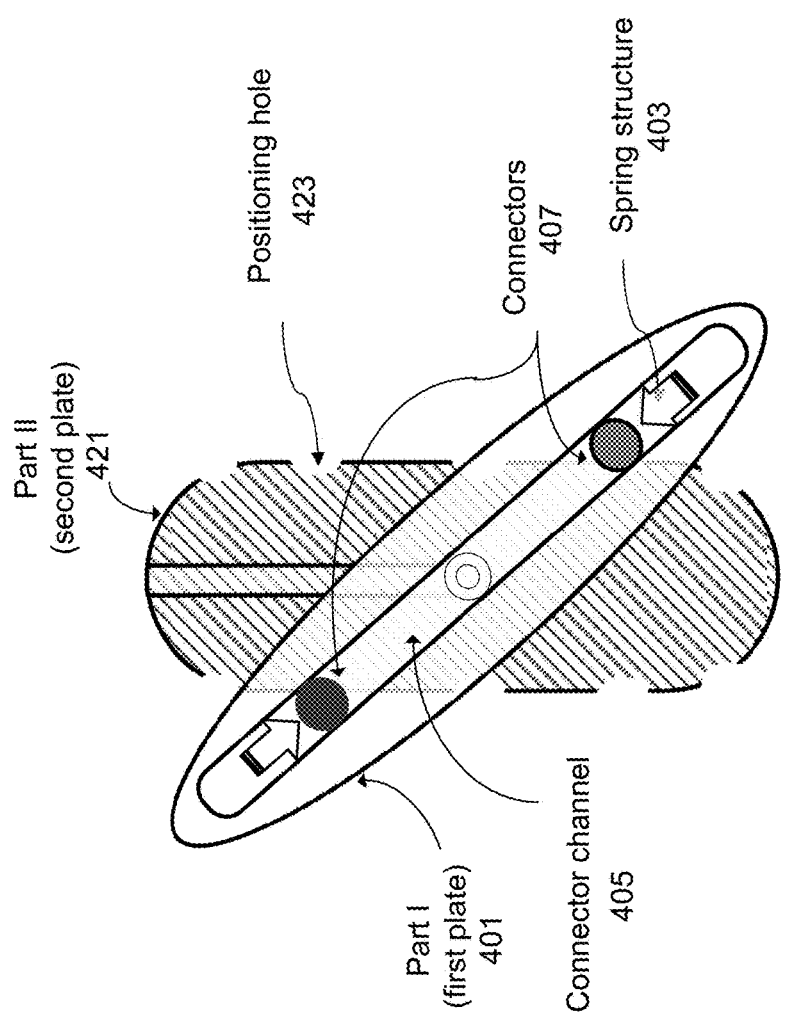
FIG. 5 illustrates an example of a first hardware design used for interconnecting between fluid connectors of a server and fluid connectors of a rack that allows an adjustment of the vertical relative locations of the connectors of the server to match the connectors of the rack according to one embodiment.

FIG. 5 illustrates an example of a first hardware design used for interconnecting between fluid connectors of a server and fluid connectors of a rack that allows an adjustment of the vertical relative locations of the connectors of the server to match the connectors of the rack according to one embodiment. The first hardware design may be design 400 of FIG. 4.

The fluid manifold of the rack may be in a staggered configuration in which pairs of connectors have a relative vertical separation. In another scenario, there may be only two connectors (one supply and one return) in the staggered configuration available on the rack, while the other connectors on the rack are all occupied by other servers. For example, a pair of connectors of the rack may extend diagonally at a certain angle from the horizontal plane. As a result, first plate 401 is rotated to mount connectors 407 of the server into a pair of positioning holes 423 along the diagonal plane to align with the connectors of the rack. The connectors 407 as positioned are separated both horizontally and vertically. The horizontal distance between connectors 407 may be the same as that in FIG. 4 when connectors 407 are positioned along the horizontal plane. The inward mounting pressure exerted by spring structure 403 against connectors 407 along the axis of connector channel 405 ensures that connectors 407 are securely mounted into the pair of diagonal positioning holes 423.

If the connectors of the rack extend diagonally at an even steeper angle, or if the available connectors of the rack are even further away from each other vertically, first plate 401 may be further rotated to mount connectors 407 of the server into a pair of mounting holes 423 further away from the horizontal plane to align with the connectors of the rack. Both the horizontal distance and the vertical distance between connectors 407 may vary as a function of the pair of positioning holes 423 into which connectors 407 are mounted to flexibly align with the fluid manifold configuration of the rack.

Figure 6:
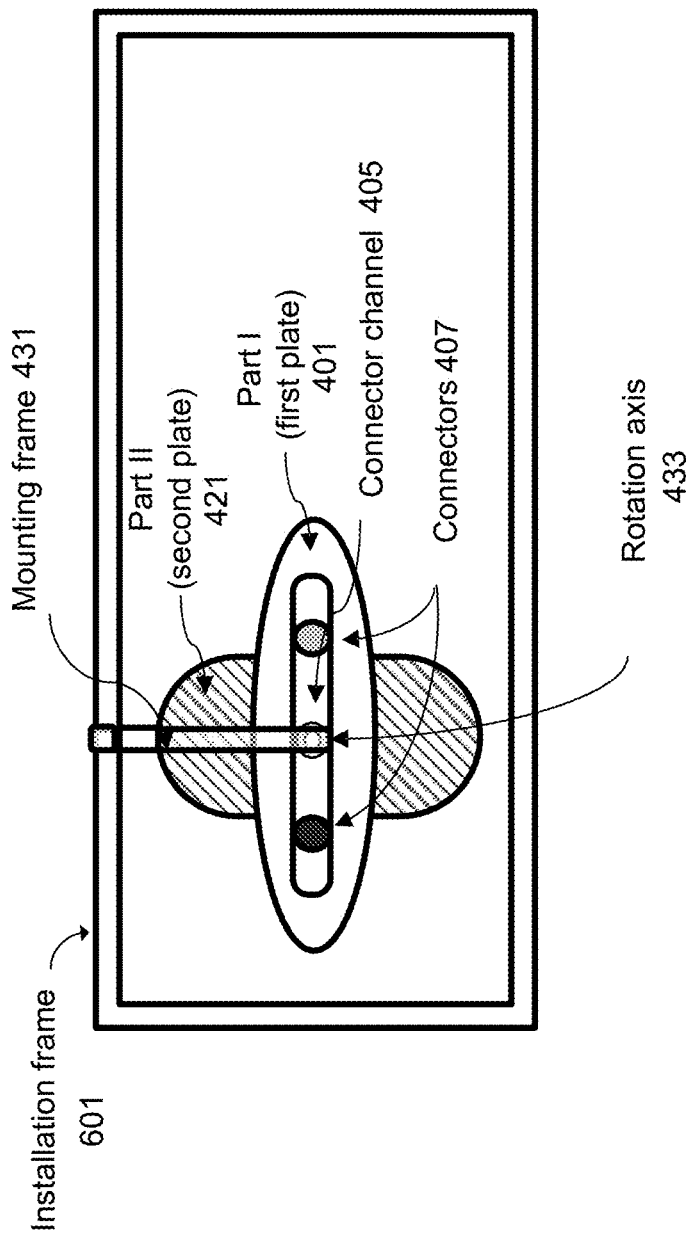
FIG. 6 illustrates an example of the first hardware design integrated to a server chassis to interconnect fluid connectors of a server and fluid connectors of a rack that allows an adjustment of the locations of the connectors of the server to match the connectors of the rack according to one embodiment.

FIG. 6 illustrates an example of the first hardware design integrated to a server chassis to interconnect fluid connectors of a server and fluid connectors of a rack that allows an adjustment of the locations of the connectors of the server to match the connectors of the rack according to one embodiment.

In one aspect, the design may include an integrated assembly of second plate 421 assembled behind first plate 401. In one aspect, the design may include a detachable configuration allowing different configurations of second plate 421 to be attached to the back first plate 401. The assembly of the first plate 401 and second plate 421 is mounted to an installation frame 601 using mounting frame 431. The installation frame 601 is mounted to a chassis of the server (not shown). Connectors 407 may include a server liquid intake connector and a server liquid outlet connector coupled respectively to a flexible hose to distribute the cooling liquid to the server and to return heated liquid from the server. Connectors 407 are guided through connector channel 405 of first plate 401 and mounted into positioning holes (not shown) of second plate 421 to align with the connectors of the fluid manifold configuration of the rack to make the connections to the rack.

Figure 7:
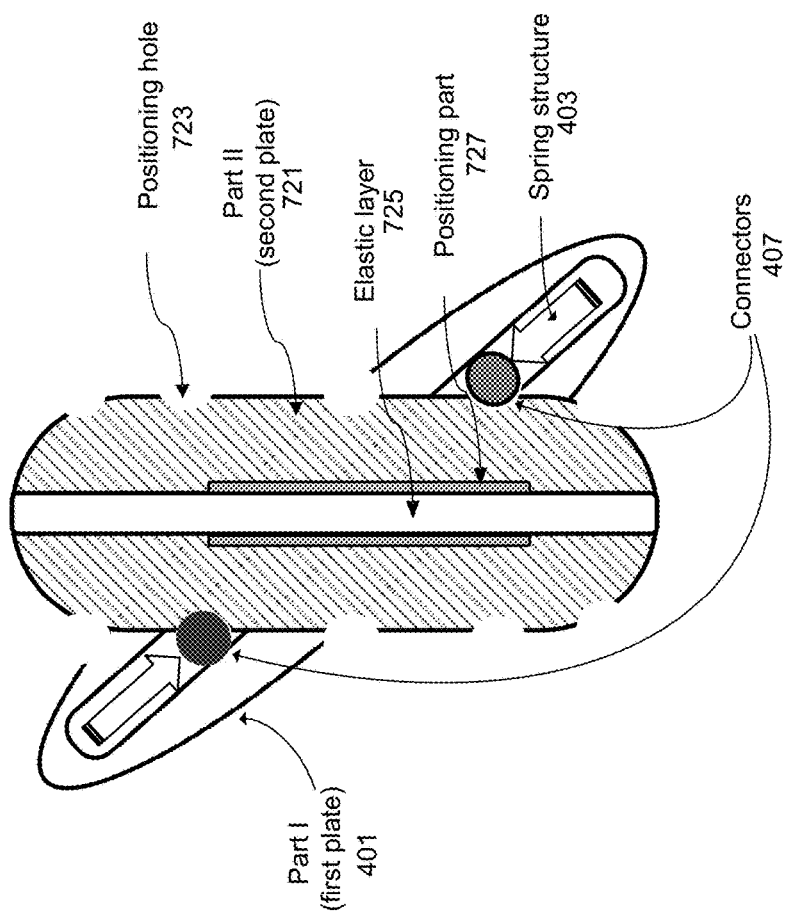
FIG. 7 illustrates an example of a second hardware design with an integrated elastic layer that is expandable along the horizontal direction for interconnecting between fluid connectors of a server and fluid connectors of a rack in a staggered connection configuration according to one embodiment.

FIG. 7 illustrates an example of a second hardware design 700 with an integrated elastic layer that is expandable along the horizontal direction for interconnecting between fluid connectors of a server and fluid connectors of a rack in a staggered connection configuration according to one embodiment. The hardware design 700 includes two components, part I (401) and part II (721), also referred to as first plate 401 and second plate 721, respectively. In one aspect, first plate 401 and second plate 721 may be separate units that are joined, attached, or assembled to form the hardware design 700 instead of being constructed as an integrated assembly. The two plates are detachable from one another to provide the flexibility to assemble different combinations of first plate 401 and second plate 721. In one aspect, second plate 721 may be attached to the front of first plate 401. The first plate 401 may have the same features as in FIGS. 4-6. The detailed structures and operations of first plate 401 are omitted for sake of brevity.

The second plate 721 has a number of positioning holes 723 around its perimeter as the second plate 421 of FIGS. 4-6. In addition, second plate 721 has a middle elastic layer 725 sandwiched between two rigid sides and running through second plate 721 in the vertical or longitudinal direction. Elastic layer 725 is designed with an internal elastic structure to generate an outward force to expand the width of second plate 721 in the horizontal or lateral direction. Two positioning parts 727, one on each side of elastic layer 725, may project from second plate 721. Positioning parts 727, also referred to as guiding structures, are used to compress elastic layer 725 to change the width of elastic layer 725 and correspondingly the width of second plate 721 to provide more flexibility when adjusting the horizontal distance between connectors 407 of the server to align with the horizontal distance between the connectors of the rack. For example, when no external force is applied to positioning parts 727, elastic layer 725 and correspondingly second plate 721 may expand to its maximum width in the horizontal direction. The horizontal outward force from the fully expanded second plate 721 and the inward force exerted by spring structure 403 along the axis of connector channel of first plate 401 securely mounts connectors 407 of the server into positioning holes 723.

When an external force is applied to pressurize positioning parts 727 closer together or when the relative distance of positioning parts 727 is set at less than the fully expanded width of elastic layer 725, the elastic layer 725 is compressed and correspondingly the width of second plate 721 is reduced. By varying the width of elastic layer 725, the horizontal distance between connectors 407 of the server may be adjusted due to the changed width of second plate 721. Again, the compressed elastic layer 725 applies a horizontal outward force to connectors 407 to counteract the inward force exerted by spring structure 403 along the axis of connector channel of first plate 401 to securely hold connectors 407 in positioning holes 723. In one aspect, the width of second plate 721 may be determined by the dimension of the rack manifold by inserting or attaching positioning parts 727 to the rack manifold. This way, the relative distance in the horizontal direction between connectors 407 of the server may be automatically adjusted to align with the connectors of the rack based on the fluid manifold configuration of the rack. The relative distance in the vertical direction between connectors 407 of the server may be adjusted by rotating first plate 401 with respect to second plate 721, similar to FIGS. 4-6. FIG. 7 shows connectors 407 of the server in the staggered connection configuration in which connectors 407 have relative distance in the vertical direction. To further extend the range of adjustments of the horizontal and vertical distances of connectors 407 of the server to accommodate a diversity of rack manifolds, second plate 721 with different maximum width and internal elastic structure of elastic layer 725 and different locations of positioning hole 723 may be attached to first plate 401. In one embodiment, first plate 401 with different dimensions of connector channel 405 may also be attached to second plate 721 to further extend the range of adjustments of the horizontal distance or the maximum width between connectors 407 of the server.

Figure 8:
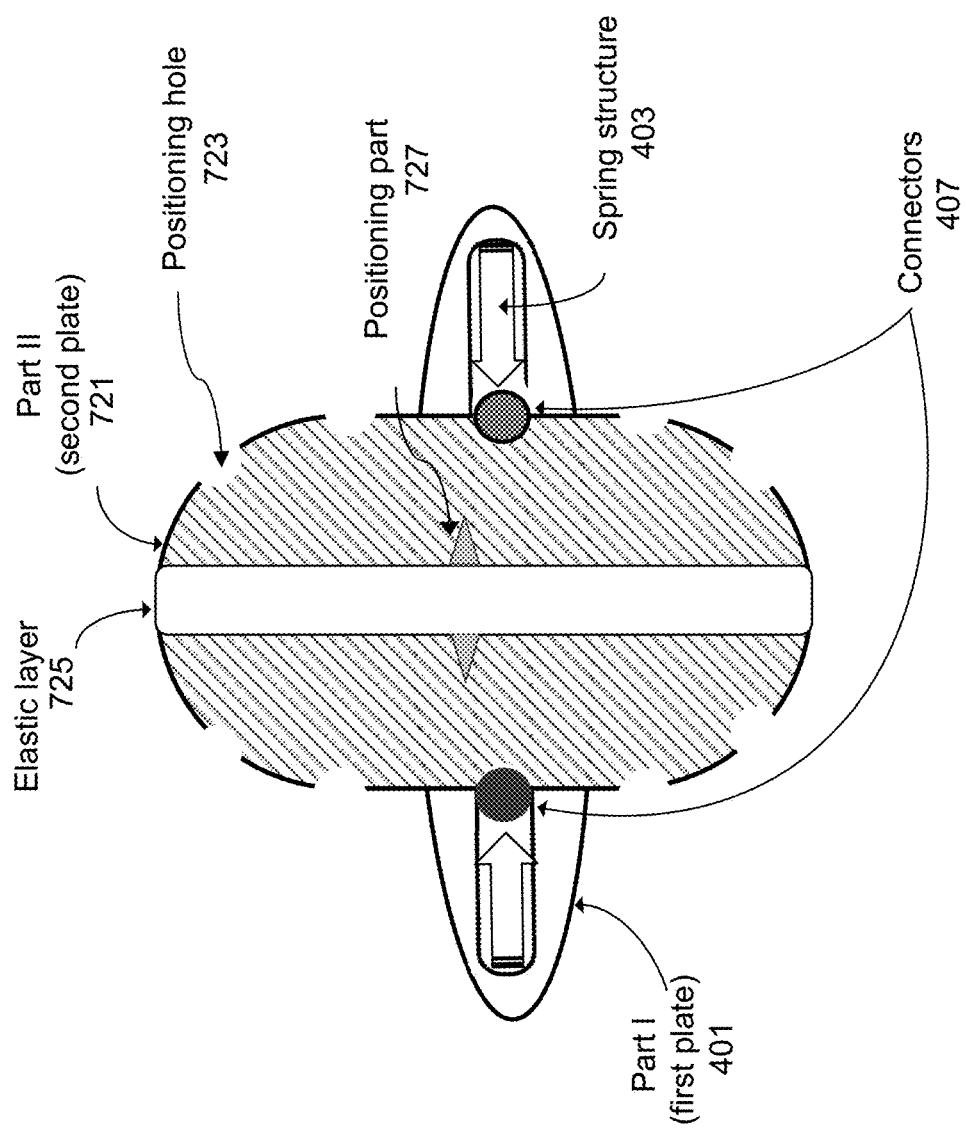
FIG. 8 illustrates an example of a hardware second design with an integrated elastic layer that is expandable along the horizontal direction for interconnecting between fluid connectors of a server and fluid connectors of a rack in a parallel connection configuration according to one embodiment.

FIG. 8 illustrates an example of a hardware second design with an integrated elastic layer that is expandable along the horizontal direction for interconnecting between fluid connectors of a server and fluid connectors of a rack in a parallel connection configuration according to one embodiment.

The first plate 401 is rotated to mount connectors 407 of the server into the pair of positioning holes 723 along the horizontal plane with zero relative vertical distance to align with the connectors of the rack. The relative distance of positioning parts 727 may be adjusted to compress elastic layer 725 to change the width of second plate 721 and correspondingly the relative distance between connectors 407 in the horizontal direction. In one aspect, positioning parts 727 may be in a triangular shape to facilitate the insertion of positioning parts 727 into the rack manifold to automatically adjust the relative distance in the horizontal direction between connectors 407 of the server to align with the connectors of the rack based on the fluid manifold configuration of the rack. In one aspect, positioning parts 727 may be configured in different shapes and dimensions to facilitate the insertion or attachment of positioning parts 727 to different rack manifolds and the mating of the connectors between the server and the rack. In one aspect, elastic layer 725, positioning parts 727, the two rigid sides sandwiching elastic layer 725, and positioning holes 723 are integrated as a single assembly of second plate 721.

Figure 9:
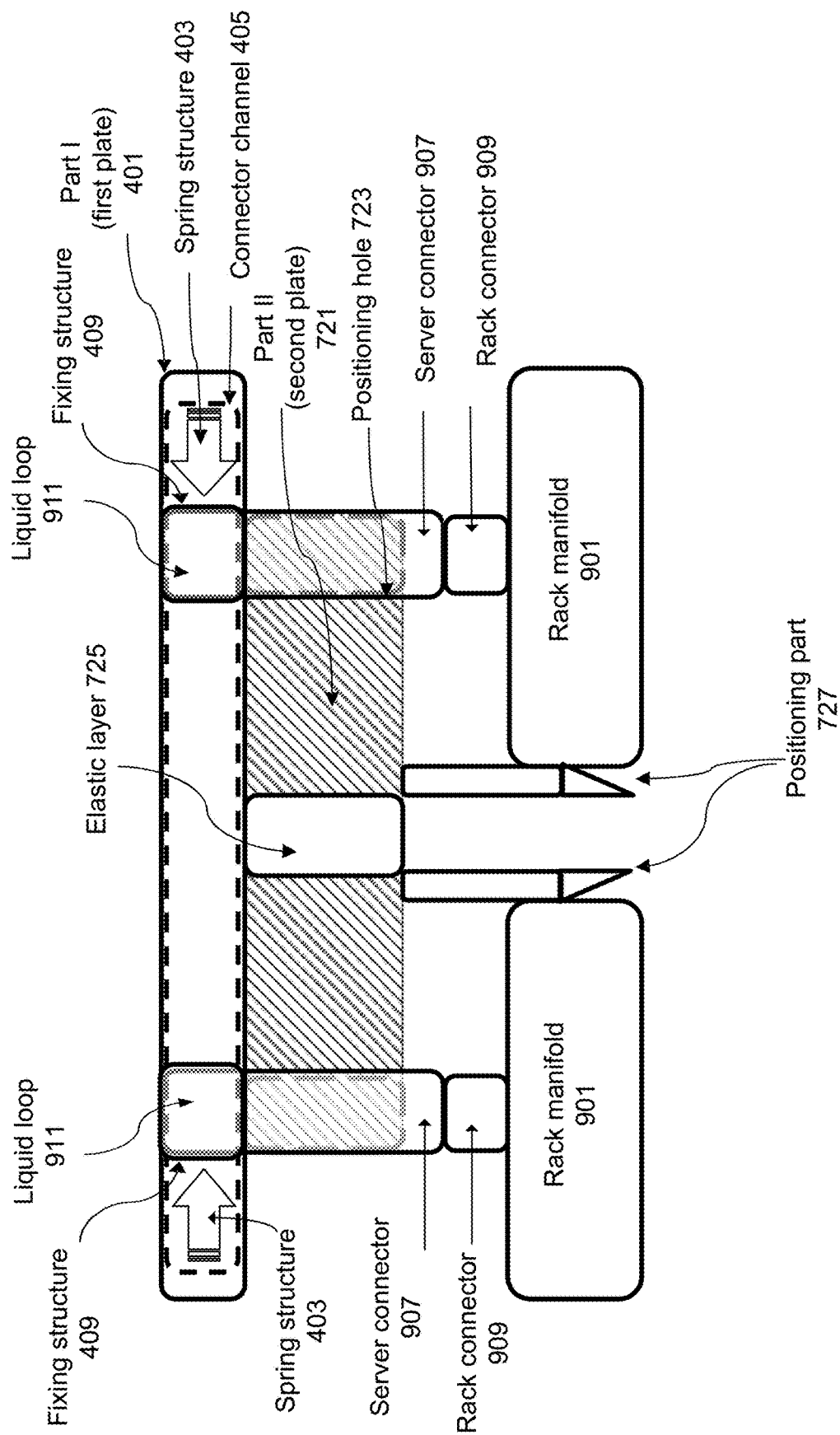
FIG. 9 illustrates an example of a top view of the connections between fluid connectors of a server and fluid connectors of a rack using the second hardware design with the integrated elastic layer that is expandable along the horizontal direction to allow an adjustment of the locations of the connectors of the server to match the connectors of the rack according to one embodiment.

FIG. 9 illustrates an example of a top view of the connections between fluid connectors of a server and fluid connectors of a rack using the second hardware design with the integrated elastic layer that is expandable along the horizontal direction to allow an adjustment of the locations of the connectors of the server to match the connectors of the rack according to one embodiment.

The connectors 907 of the server may include a server liquid intake connector and a server liquid outlet connector coupled respectively to a flexible hose to distribute the cooling liquid to the server and to return heated liquid from the server as part of the liquid loop 911 (only partially shown). Server connectors 907 are guided through connector channel 405 of first plate 401. Second plate 721 is attached to the front of first plate 401 between server connectors 907 and server connectors 907 are mounted into positioning holes 723 of second plate 721. In one aspect, the assembly of first plate 401 and second plate 721 may be mounted to a chassis of the server using a mounting frame. The spring structure 403 on each end of connector channel 405 of first plate 401 exerts an inward force on server connectors 907 along the axis of connector channel 405. Elastic layer 725 of second plate 721 exerts a horizontal outward force on server connectors 907. The inward force and counteracting outward force securely holds server connectors 907 in positioning holes 723. In addition, a fixing structure 409 is used to lock and keep each one of server connectors 907 oriented perpendicularly to connector channel 405 of first plate 401 to reduce strain on server connectors 907 when mated to rack connectors 909.

The rack manifold 901 includes a supply side manifold having a rack connector 909, which may also be referred to a rack inlet connector, to be mated to the server liquid intake connector to supply the cooling liquid to the server, and a return side manifold having a rack connector 909, which may also be referred to as a rack outlet connector, to be mated to the server liquid outlet connector to return the heated liquid from the server. The supply side manifold and the return side manifold may be separated by an opening. Positioning parts 727 of second plate 721 are inserted through the opening of rack manifold 901 to compress elastic layer 725 to change the relative distance in the horizontal direction between server connectors 907 to align with the relative distance in the horizontal direction between rack connectors 909. The width of second plate 721 may be automatically adjusted to attain the proper alignment of server connectors 907 and rack connectors 909 by inserting positioning parts 727 through different size openings of rack manifold 901. In one aspect, positioning parts 727 may have a triangular pointed end to facilitate the insertion of positioning parts 727 into the opening of rack manifold 901.

If rack connectors 909 of the supply side manifold and the return side manifold are staggered, first plate 401 may be rotated with respect to second plate 721 to align server connectors 907 and rack connectors 909 in the vertical direction. After alignment, server connectors 907 and rack connectors 909 may be mated using the blind-mating connection to complete the liquid loop 911 for the server. The assembly of first plate 401 and second plate 721 with elastic layer 725 and positioning parts 727 allows servers having variable fluid distribution architecture to be integrated to racks with different fluid manifold configuration by automatically aligning server connectors 907 with rack connectors 909, improving interoperability between the servers and racks, increasing flexibility in data center design, and providing reliable blind-mating fluid connections.

Figure 10:
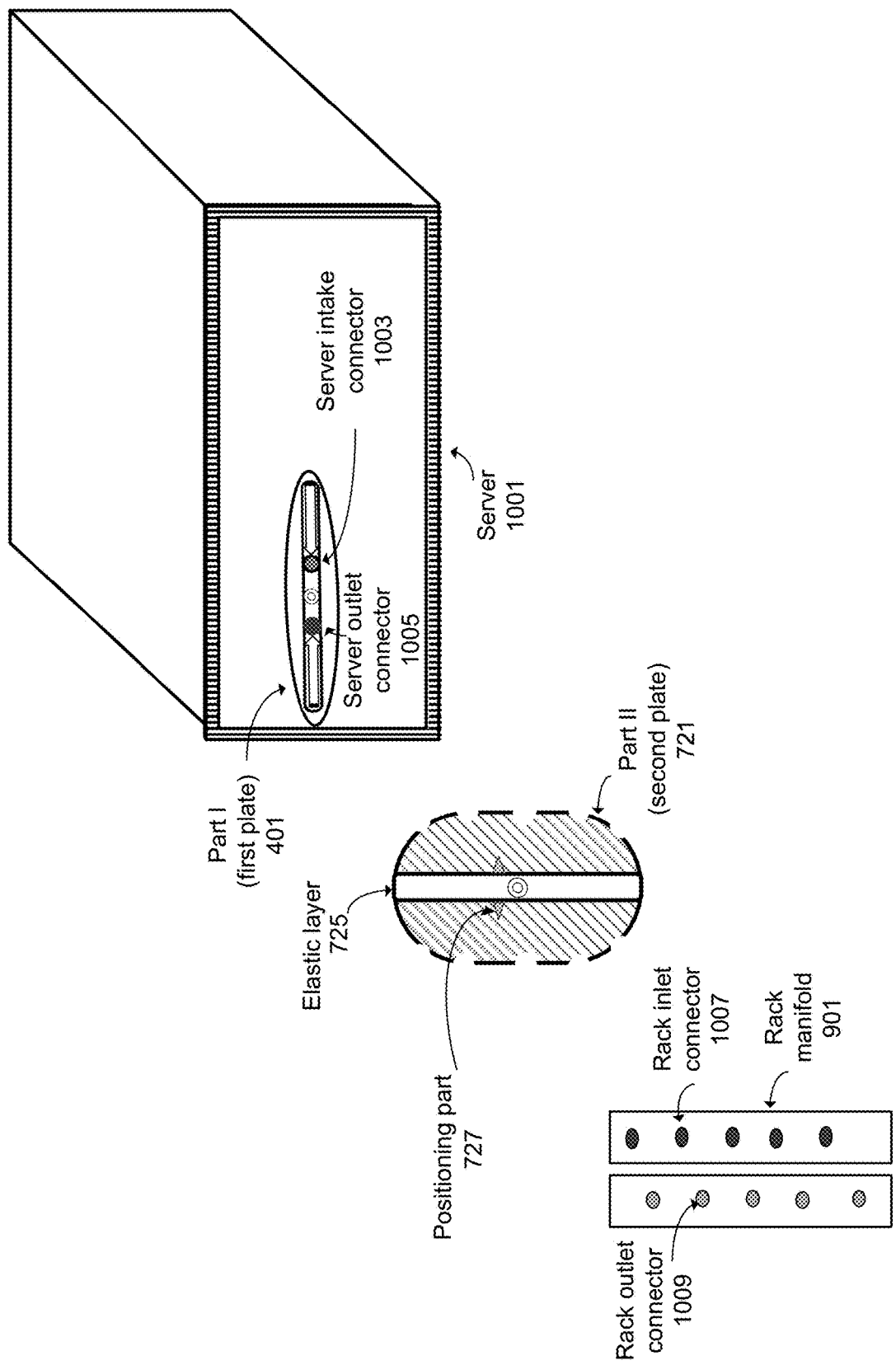
FIG. 10 illustrates an example of a rack manifold, the second hardware design that includes part II with the integrated elastic layer that is expandable along the horizontal direction and part I integrated to a server, prior to assembling the two parts of the second hardware design and integrating the rack manifold and the second hardware design for connecting the fluid connectors of the server to the fluid connectors of the rack manifold according to one embodiment.

FIG. 10 illustrates an example of a rack manifold, 901, the second hardware design that includes the second plate 721 with integrated elastic layer 725 that is expandable along the horizontal direction, and first plate 401 integrated to a server 1001, prior to assembling the two plates of the second hardware design and integrating the rack manifold and the assembled second hardware design for connecting the fluid connectors of server 1001 to the fluid connectors of rack manifold 901 according to one embodiment.

In one aspect, first plate 401 may be mounted to an installation frame of server 1001 using a mounting frame attached to first plate 401. The installation frame may be mounted to the chassis of server 1001. A server intake connector 1003 and a server outlet connector 1005 of the server fluid distribution system may be guided through the connector channel of first plate 401. In one aspect, second plate 721 may be a component developed and provided by a rack vendor to be compatible with racks from the vendor having various fluid manifold configurations. In one aspect, second plate 721 may be developed by a server vendor and provided as the hardware assembled with first plate 401 for integration with server 1001.

Rack manifold 901 may include a supply side manifold having multiple rack inlet connectors 1007 to supply the cooling liquid to server 1001 and a return side manifold having multiple rack outlet connectors 1009 to return the heated liquid from server 1001. In one aspect, rack inlet connectors 1007 may be vertically offset from rack outlet connectors 1009 in a staggered connection configuration. The supply side manifold and the return side manifold may be separated by an opening through which positioning parts 727 of second plate 721 may be inserted to change the width of second plate 721 to align server intake connector 1003 and server outlet connector 1005 with rack inlet connector 1007 and rack outlet connector 1009, respectively for making the blind-mating connections. In this respect, second plate 721 functions as an adapting layer between the connectors of the server 1001 and rack manifold 901, and is used to position, secure, and align the connectors for integrating servers and racks.

Figure 11:
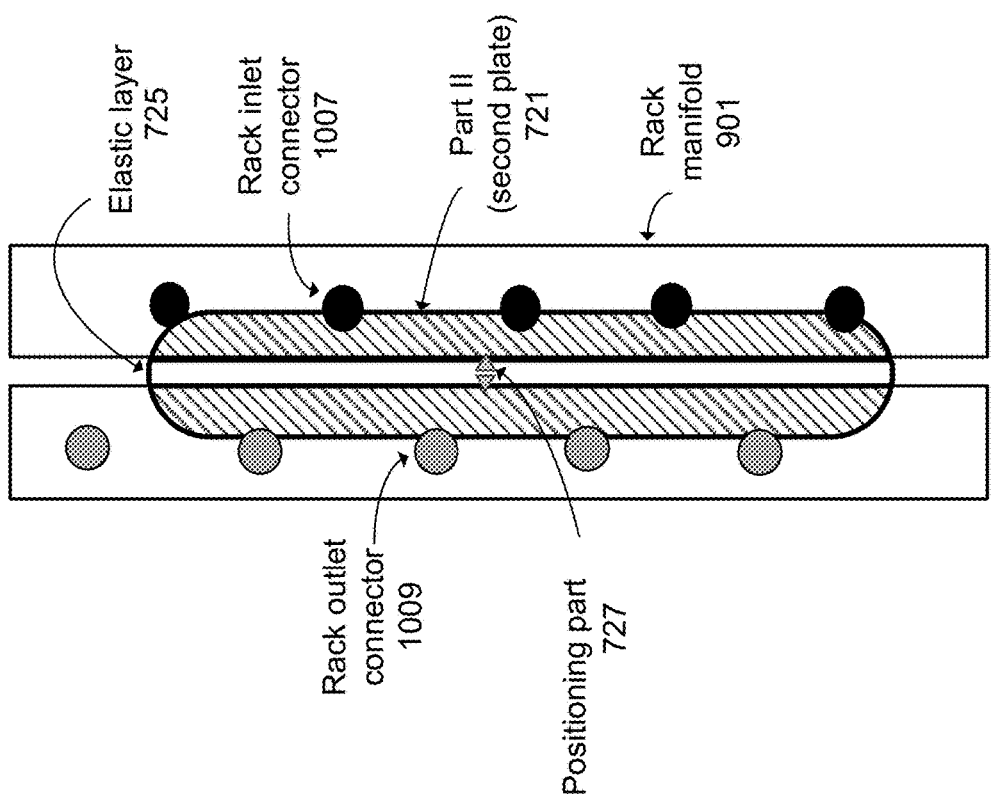
FIG. 11 illustrates an example of an integrated assembly of a rack manifold and the second hardware design that includes part II with the integrated elastic layer that is expandable along the horizontal direction according to one embodiment.

FIG. 11 illustrates an example of an integrated assembly of a rack manifold 901 and the second hardware design that includes second plate 721 with the integrated elastic layer 725 that is expandable along the horizontal direction according to one embodiment.

The rack manifold 901 has multiple inlet connectors 1007 vertically offset from multiple rack outlet connectors 1009 in a staggered connection configuration as in FIG. 10. FIG. 11 shows that positioning parts 727 are inserted into the opening between the supply side manifold and the return side manifold. The width of second plate 721 automatically adjusts in accordance with the width of the opening to align rack inlet connectors 1007 and rack outlet connectors 1009 with the positioning holes of second plate 721 to facilitate aligning rack inlet connectors 1007 and rack outlet connectors 1009 with the connectors of the server.

Figure 12:
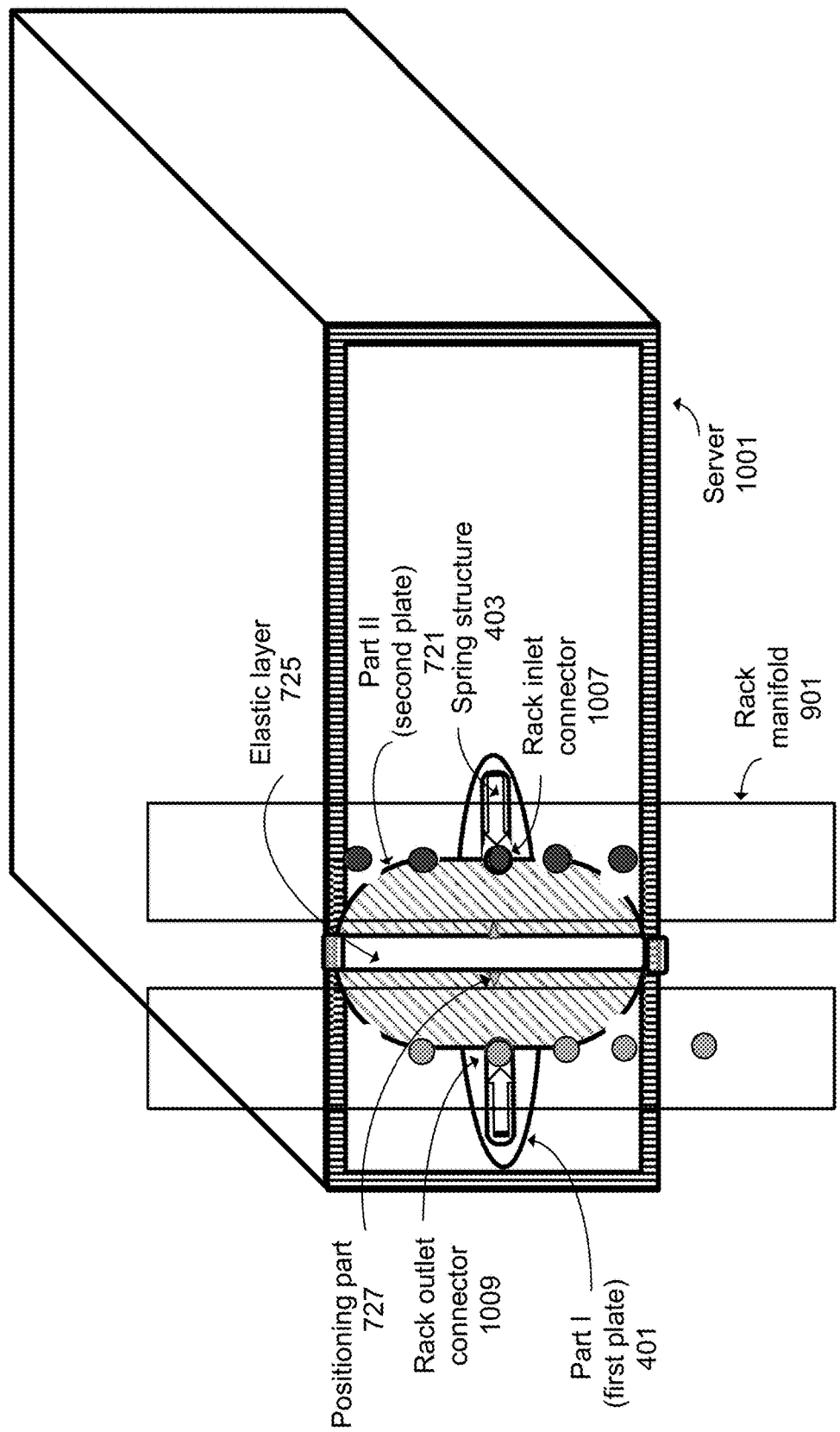
FIG. 12 illustrates an example of a perspective view of a fully integrated assembly of a rack manifold and the second hardware design including the first plate and the second plate with the integrated elastic layer that is expandable along the horizontal direction to match and connect fluid connectors of the server to fluid connectors of the rack manifold according to one embodiment.

FIG. 12 illustrates an example of a perspective view of a fully integrated assembly of rack manifold 901 and the second hardware design including first plate 401 and second plate 721 with the integrated elastic layer 725 that is expandable along the horizontal direction to match and connect fluid connectors of the server to fluid connectors of the rack manifold according to one embodiment.

The elastic layer 725 is compressed by the insertion of positioning parts 727 into the opening in rack manifold 901 to align rack inlet connector 1007 and rack outlet connector 1009 with the server intake connector and the server outlet connector (both hidden from view), respectively. The inward force exerted by spring structure 403 of first plate 401 and the outward force from the compressed elastic layer 725 holds the server intake connector and server outlet connector securely in the positioning holes of second plate 721 to enable the blind-mating connection to be made to the connectors of the rack manifold. FIG. 12 shows the connectors of the rack manifold in the parallel configuration. If the connectors of the rack manifold are staggered with a vertical offset, first plate 401 may be rotated. The assembly of first plate 401 and second plate 721 with elastic layer 725 and positioning parts 727 allows server 1001 using a single connector design to be integrated to connectors of rack manifolds with different relative vertical and horizontal distances, improving interoperability between servers and racks, increasing flexibility in data center design, and providing reliable blind-mating fluid connections.

FIG. 13A illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a parallel configuration according to one embodiment.

The assembly of first plate 401 and second plate 721 is mounted to a server chassis 1315 using a mounting frame 431. The server chassis 1315 houses one or more PCBs 1307 of a server on which are populated electronic components and cooling modules 1309. In one aspect, PCB 1307, electronic components and cooling module 1309 may be the PCB and the processor/cold plate assembly 300 as described in FIG. 3. The cooling liquid, supplied by the rack inlet connector of the rack manifold through the server intake connector aligned using first plate 401 and second plate 721, flows through loop supply line 1301 for distribution to modules 1309. A portion of the heat generated by the electronic components is removed by the cooling liquid via cooling modules 1309. The heated liquid returns through loop return line 1303, the server outlet connector aligned using first plate 401 and second plate 721, and out to the rack outlet connector of the rack manifold.

FIG. 13B illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a staggered configuration according to one embodiment. FIG. 13B differs from FIG. 13A in that the connectors of the rack manifold are staggered with a vertical offset. Using the same hardware design, first plate 401 may be rotated to maintain the alignment of the connectors of the server with the connectors of the rack manifold.

FIG. 13C illustrates an example of a top view of a fully integrated assembly of a rack manifold and the second hardware design with the integrated elastic layer that is expandable along the horizontal direction to match and connect fluid connectors of the server to fluid connectors of the rack manifold when the connectors are in a reversed configuration according to one embodiment. FIG. 13B differs from FIG. 13A in that the positions of the rack inlet connector and the rack outlet connector are reversed. Using the same hardware design, first plate may be rotated by 180 degrees to align the connectors of the server to the connectors of the rack manifold with the right flow direction.

FIG. 14A illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a parallel configuration corresponding to FIG. 13A according to one embodiment. FIG. 14A shows the rack inlet connector connected to loop supply line 1301 of the server and the rack outlet connector connected to loop return line 1303 of the server are in the parallel configuration with no vertical offset.

FIG. 14B illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a staggered configuration corresponding to FIG. 13B according to one embodiment. FIG. 14B shows the rack inlet connector connected to loop supply line 1301 of the server and the rack outlet connector connected to loop return line 1303 of the server are in the staggered configuration with a vertical offset. First plate 401 may be rotated to maintain the alignment of the connectors of the server with the connectors of the rack manifold.

FIG. 14C illustrates an example of a view from behind the rack of a fully integrated assembly of a rack manifold and the second hardware design with the integrated elastic layer that is expandable along the horizontal direction to match and connect fluid connectors of the server to fluid connectors of the rack manifold when the connectors are in a reversed configuration corresponding to FIG. 13C according to one embodiment. FIG. 14C shows that the rack inlet connector connected to loop supply line 1301 of the server and the rack outlet connector connected to loop return line 1303 of the server are reversed from those of FIG. 14A. First plate 401 may be rotated by 180 degrees to align the server intake connector and server outlet connector to the rack inlet connector and the rack outlet connector, respectively, to achieve the right flow direction of loop supply line 1301 and loop return line 1303.

As illustrated in FIGS. 13A, 13B, 13C, 14A, 14B, and 14C, the hardware design of first plate 401 and second plate 721 with elastic layer 725 allows a server using a single connector design to be integrated to connectors of rack manifolds with different relative vertical distances, different horizontal distances, and different directions of fluid flow, improving interoperability between servers and racks, increasing flexibility in data center design, and providing reliable blind-mating fluid connections.

Figure 15:
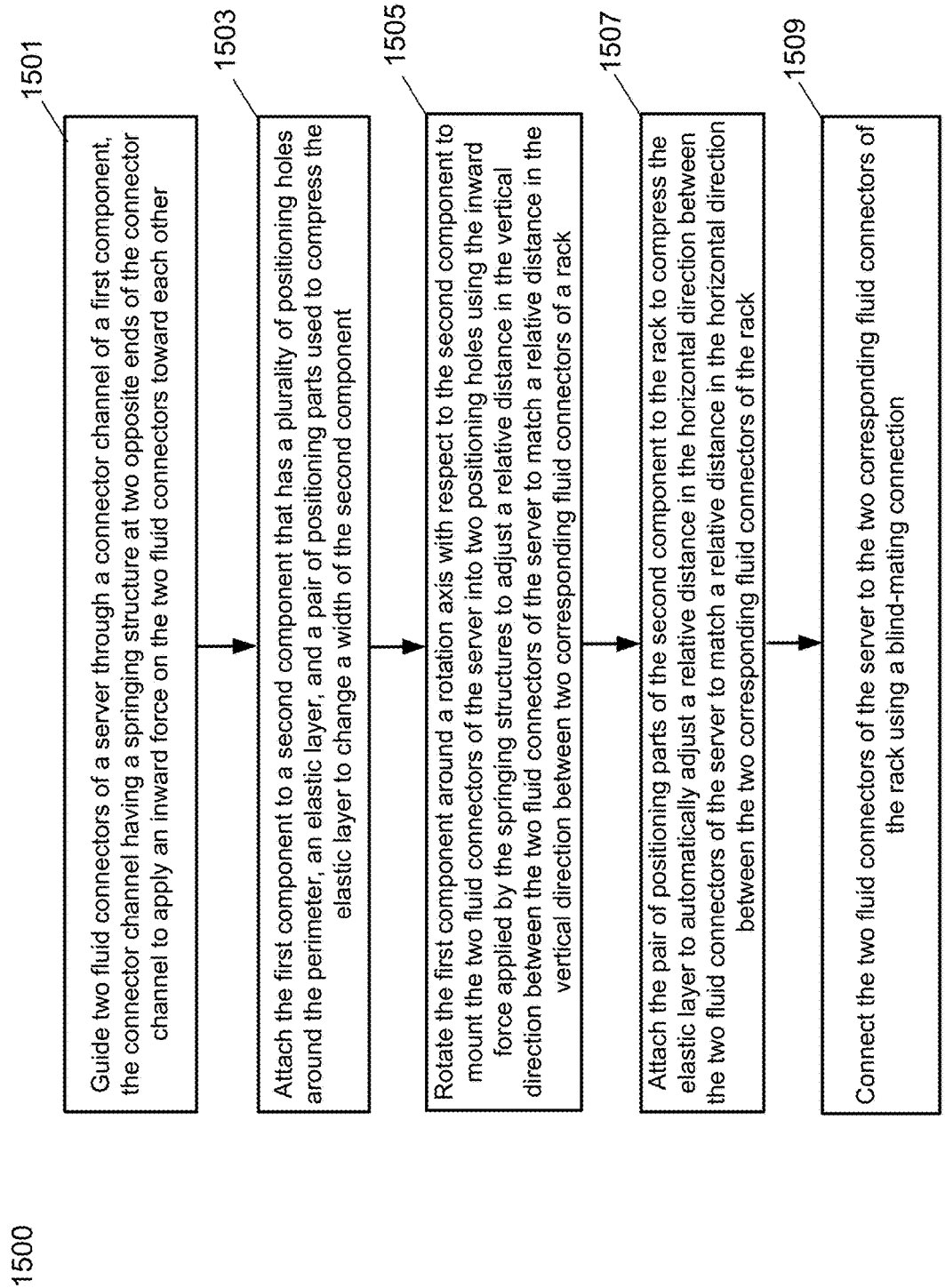
FIG. 15 is a flow diagram illustrating an example of a method 1500 for aligning two fluid connectors of a server with two corresponding fluid connectors of a rack housing the server using the second hardware design with an integrated elastic layer that is expandable along the horizontal direction prior to connecting the two fluid connectors of the server with the two corresponding fluid connectors of the rack using blind-mating connections.

FIG. 15 is a flow diagram illustrating an example of a method 1500 for aligning two fluid connectors of a server with two corresponding fluid connectors of a rack housing the server using the second hardware design with an integrated elastic layer that is expandable along the horizontal direction prior to connecting the two fluid connectors of the server with the two corresponding fluid connectors of the rack using blind-mating connections. In one embodiment, method 1500 may be performed to achieve the blind-mating connections of FIGS. 9, 12, 13A, 13B, 13C, 14A, 14B, and 14C.

In operation 1501, method 1500 guides the two fluid connectors of a server through a connector channel of a first component. The first component has a springing structure at each of two opposite ends of the connector channel. The pair of springing structures are used to apply an inward force on the two fluid connectors in the connector channel toward each other and away from the opposite ends of the connector channel.

In operation 1503, method 1500 attaches the first component to a second component. The second component has a number of positioning holes around its perimeter, an elastic layer along a vertical direction of the second component, and a pair of positioning parts used to apply an external force to compress the elastic layer to change a width of the second component in the horizontal direction.

In operation 1505, method 1500 rotates the first component around a rotation axis with respect to the second component to mount the two fluid connectors of the server into two positioning holes on opposite edges of the second component using the inward force applied by the pair of springing structure to adjust a relative distance in the vertical direction between the two fluid connectors of the server to match a relative distance in the vertical direction between the two corresponding fluid connectors of the rack.

In operation 1507, method 1500 attaches the pair of positioning parts of the second component to the rack to compress the elastic layer to automatically adjust a relative distance in the horizontal direction between the two fluid connectors of the server to match a relative distance in the horizontal direction between the two corresponding fluid connectors of the rack.

In operation 1509, method 1500 connects the two fluid connectors of the server to the two corresponding fluid connectors of the rack using a blind-mating connection.

In the foregoing specification, embodiments of the invention have been described with reference to specific exemplary embodiments thereof. It will be evident that various modifications may be made thereto without departing from the broader spirit and scope of the invention as set forth in the following claims. For example, the first plate and the second plate may be in different form factors to accommodate servers having different fluid distribution architectures and racks having different fluid manifold configurations. The design of the positioning parts of the second plate may be in different shapes and dimensions to facilitate the insertion or attachment of the positioning parts to different rack manifolds. The specification and drawings are, accordingly, to be regarded in an illustrative sense rather than a restrictive sense.

What is claimed is:

1. An apparatus of a server, comprising:
   a first component including:
      a connector channel configured to guide two fluid connectors through the first component at two opposite positions along the connector channel; and
      a pair of springing structures each situated at one of two opposite ends of the connector channel, the pair of springing structures being configured to apply an inward force on the two fluid connectors toward each other; and
   a second component having a plurality of positioning holes located around a perimeter of the second component,
   the first component being rotatable around a rotation axis with respect to the second component, when the first component and the second component are assembled to allow the two fluid connectors to be mounted into two of the positioning holes on opposite edges of the second component by the inward force applied by the pair of springing structures.

2. The apparatus of claim 1, wherein the first component is rotatable around the rotation axis to change a relative distance between the two fluid connectors in a horizontal direction and a vertical direction.

3. The apparatus of claim 1, wherein the two fluid connectors comprise an inlet fluid connector and an outlet fluid connector of a liquid cooling loop of the server, and wherein the inlet fluid connector and the outlet fluid connector mounted into the two positioning holes of the second component are aligned with a corresponding inlet fluid connector and a corresponding outlet fluid connector of a rack housing the server.

4. The apparatus of claim 1, wherein the second component further comprises:
   an elastic layer that traverses in a vertical direction of the second component; and
   a pair of positioning parts each situated on an opposite side of the elastic layer, wherein the positioning parts are configured to be applied with an external force to compress the elastic layer to change a width of the second component in a horizontal direction.

5. The apparatus of claim 4, wherein the elastic layer when compressed exerts an outward force on the two fluid connectors away from each other in the horizontal direction to counteract the inward force applied by the springing structures.

6. The apparatus of claim 4, wherein the external force is applied to the pair of positioning parts to change a relative distance between the two fluid connectors in the horizontal direction and wherein the first component is rotated around the rotation axis to change a relative distance between the two fluid connectors in the vertical direction.

7. The apparatus of claim 4, wherein the two fluid connectors comprise an inlet fluid connector and an outlet fluid connector of a liquid cooling loop of the server, and wherein the pair of positioning parts are attached to a rack housing the server to apply the external force to automatically align the inlet fluid connector and the outlet fluid connector with a corresponding inlet fluid connector and a corresponding outlet fluid connector of the rack.

8. The apparatus of claim 7, wherein the first component is attached to a server chassis of the server and wherein the first component and the second component are assembled to position the second component between the first component and the rack.

9. The apparatus of claim 4, wherein the first component further comprises a pair of fixing structures configured to keep the two fluid connectors oriented perpendicularly to the connector channel.

10. A server rack of a data center, comprising:
a rack manifold having a rack liquid supply line to receive cooling liquid from a cooling liquid source and a rack liquid return line to return warmer liquid back to the cooling liquid source;
a plurality of server chassis, each server chassis including one or more cold plates associated with one or more information technology (IT) components; and
an connector adaptor for interconnecting the rack manifold and one of the server chassis, the connector adaptor including:
a first component including:
a connector channel configured to guide two fluid connectors of the IT components of the server chassis through the first component at two opposite positions along the connector channel; and
a pair of springing structures each situated at one of two opposite ends of the connector channel, the pair of springing structures are configured to apply an inward force on the two fluid connectors toward each other;
and
a second component having a plurality of positioning holes located around a perimeter of the second component, wherein the first component is rotatable around a rotation axis with respect to the second component when the first component and the second component are assembled to mount the two fluid connectors into two of the positioning holes on opposite edges of the second component by the inward force applied by the pair of springing structures.

11. The server rack of claim 10, wherein the first component is rotatable around the rotation axis to change a relative distance between the two fluid connectors in a horizontal direction and a vertical direction.

12. The server rack of claim 10, wherein the two fluid connectors comprise an inlet fluid connector and an outlet fluid connector of a liquid cooling loop of the IT components of the server chassis, and wherein the inlet fluid connector and the outlet fluid connector mounted into the two positioning holes of the second component are aligned with a corresponding inlet fluid connector of the rack liquid supply line and a corresponding outlet fluid connector of the rack liquid return line of the rack manifold.

13. The server rack of claim 12, wherein the inlet fluid connector and the outlet fluid connector of the IT components are connected to the corresponding inlet fluid connector and the corresponding outlet fluid connector of the rack manifold using a blind-mating connection.

14. The server rack of claim 10, wherein the second component further comprises:
an elastic layer that traverses in a vertical direction of the second component; and
a pair of positioning parts each situated on an opposite side of the elastic layer, wherein the positioning parts are configured to be applied with an external force to compress the elastic layer to change a width of the second component in a horizontal direction.

15. The server rack of claim 14, wherein the elastic layer when compressed exerts an outward force on the two fluid connectors away from each other in the horizontal direction to counteract the inward force applied by the springing structures.

16. The server rack of claim 14, wherein the external force is applied to the pair of positioning parts to change a relative distance between the two fluid connectors in the horizontal direction and wherein the first component is rotated around the rotation axis to change a relative distance between the two fluid connectors in the vertical direction.

17. The server rack of claim 14, wherein the two fluid connectors comprise an inlet fluid connector and an outlet fluid connector of a liquid cooling loop of the IT components of the server chassis, and wherein the pair of positioning parts are attached to the rack manifold to apply the external force to automatically align the inlet fluid connector and the outlet fluid connector of the IT components with a corresponding inlet fluid connector of the rack liquid supply line and a corresponding outlet fluid connector of the rack liquid return line of the rack manifold.

18. The server rack of claim 17, wherein the first component is attached to the server chassis and wherein the first component and the second component are assembled to position the second component between the first component and the rack manifold.

19. The server rack of claim 14, wherein the first component further comprises a pair of fixing structures configured to keep the two fluid connectors oriented perpendicularly to the connector channel.

20. A method of connecting two fluid connectors of a liquid cooling loop of a server with two corresponding fluid connectors of a rack housing the server, comprising:
guiding the two fluid connectors of the server through a connector channel of a first component of a hardware at two opposite positions along the connector channel, the connector channel having a pair of springing structures each situated at one of two opposite ends of the connector channel to apply an inward force on the two fluid connectors toward each other;
attaching the first component to a second component of the hardware, the second component including a plurality of positioning holes located around a perimeter of the second component, an elastic layer that traverses in a vertical direction of the second component, and a pair of positioning parts used to compress the elastic layer to change a width of the second component in a horizontal direction;

rotating the first component around a rotation axis with respect to the second component to mount the two fluid connectors of the server into two of the positioning holes on opposite edges of the second component using the inward force applied by the pair of springing structures to adjust a relative distance in the vertical direction between the two fluid connectors of the server to match a relative distance in the vertical direction between the two corresponding fluid connectors of the rack;

attaching the pair of positioning parts to the rack to compress the elastic layer to automatically adjust a relative distance in the horizontal direction between the two fluid connectors of the server to match a relative distance in the horizontal direction between the two corresponding fluid connectors of the rack; and connecting the two fluid connectors of the server to the two corresponding fluid connectors of the rack using a blind-mating connection.

* * * * *